United States Patent
Shih et al.

(10) Patent No.: US 9,891,477 B2
(45) Date of Patent: Feb. 13, 2018

(54) METHOD FOR MANUFACTURING HVA PIXEL ELECTRODE AND ARRAY SUBSTITUTE

(71) Applicant: SHENZHEN CHINA STAR OPTOELECTRONICS TECHNOLOGY CO., LTD., Shenzhen (CN)

(72) Inventors: Ming Hung Shih, Shenzhen (CN); Jiali Jiang, Shenzhen (CN)

(73) Assignee: SHENZHEN CHINA STAR OPTOELECTRONICS TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 14/416,858

(22) PCT Filed: Aug. 5, 2014

(86) PCT No.: PCT/CN2014/083744
§ 371 (c)(1),
(2) Date: Jan. 23, 2015

(87) PCT Pub. No.: WO2016/008183
PCT Pub. Date: Jan. 21, 2016

(65) Prior Publication Data
US 2017/0123278 A1    May 4, 2017

(30) Foreign Application Priority Data
Jul. 18, 2014  (CN) .......................... 2014 1 0344992

(51) Int. Cl.
*H01L 27/12* (2006.01)
*G02F 1/1343* (2006.01)
*G02F 1/1368* (2006.01)

(52) U.S. Cl.
CPC ...... *G02F 1/134309* (2013.01); *G02F 1/1368* (2013.01); *G02F 1/13439* (2013.01);
(Continued)

(58) Field of Classification Search
CPC ........................ H01L 27/124; H01L 27/1288; H01L 27/1259
See application file for complete search history.

(56) References Cited

U.S. PATENT DOCUMENTS
2014/0054703 A1    2/2014    Feng et al.

FOREIGN PATENT DOCUMENTS
CN    101126848 A    2/2008
CN    102830560 A    12/2012
(Continued)

OTHER PUBLICATIONS

Office Action dated Apr. 1, 2016, by the State Intellectual Property Office of China in corresponding Chinese Patent Application No. 201410344992.X (6 pages).
(Continued)

*Primary Examiner* — Amar Movva
(74) *Attorney, Agent, or Firm* — Buchanan Ingersoll & Rooney PC

(57) ABSTRACT

The present disclosure discloses a method for manufacturing a HVA pixel electrode and an array substrate. The method comprises: a first metal material is deposited on a substrate, and a first conductive metal layer is formed through etching; a first insulating material and a semiconductor material are deposited on a first conductive metal layer, and an intermediate layer is formed through etching; a second insulating material is deposited on the intermediate layer, and a second conductive metal layer is formed through etching; the second conductive metal layer and an exposed part of the intermediate layer are coated with a second insulating material, and contact holes and a three-dimensional insulating
(Continued)

structure are formed through etching; the surface of the insulating structure and the exposed parts of other layers are coated with a transparent conductive material, and a transparent conductive layer is formed through etching. A photomasking procedure is saved, and manufacturing cost is saved. The manufacturing time of array substrate can be shortened, the production capacity can be improved, and the penetration of liquid crystal display panel can be improved.

5 Claims, 3 Drawing Sheets

(52) U.S. Cl.
CPC ........ *H01L 27/124* (2013.01); *H01L 27/1288* (2013.01); *G02F 2001/134345* (2013.01); *G02F 2201/123* (2013.01)

(56) References Cited

FOREIGN PATENT DOCUMENTS

| CN | 103323993 A | 9/2013 |
|----|-------------|--------|
| CN | 103779202 A | 5/2014 |
| CN | 104062843 A | 9/2014 |
| JP | 2002-90726 A | 3/2002 |
| JP | 2005-283691 A | 10/2005 |

OTHER PUBLICATIONS

International Search Report and Written Opinion of the International Searching Authority (PCT/ISA/237, PCT/ISA/210 and PCT/ISA/220) dated Apr. 27, 2015, by the State Intellectual Property Office of China, in corresponding International Application No. PCT/CN2014/083744. (13 pages).

METHOD FOR MANUFACTURING HVA PIXEL ELECTRODE AND ARRAY SUBSTITUTE

CROSS REFERENCE TO RELATED APPLICATION

The present application claims benefit of Chinese patent application CN 201410344992.X, entitled "Method for Manufacturing HVA Pixel Electrode and Array Substrate" and filed on Jul. 18, 2014, which is incorporated herein by reference.

FIELD OF THE INVENTION

The present disclosure relates to the technical field of liquid crystal display, and particularly to a method for manufacturing High Vertical Alignment (HVA) pixel electrode and array substrate.

BACKGROUND OF THE INVENTION

Generally speaking, a HVA pixel electrode has a Fine Slit structure, and no pixel electrode is arranged in the slit parts of said Fine Slit structure. As a result, the controllability of the slit parts over the electric field is poor, and the controllability over the liquid crystal molecules thereof is poor accordingly. Consequently, during display, dark strips would appear in the regions corresponding to the slit parts. Under the circumstances, the light transmittance efficiency of liquid crystal is suffered to a certain extent, and thus the penetration of liquid crystal display panel is suffered.

Based on the above situations, a method for manufacturing HVA pixel electrode, which can improve the penetration of liquid crystal display panel, and a corresponding array substrate are urgently needed.

SUMMARY OF THE INVENTION

To solve the aforesaid problems, the present disclosure provides a HVA pixel electrode which can improve the penetration of liquid crystal display panel, and a corresponding array substrate.

According to one aspect of the present disclosure, the present disclosure provides a method for manufacturing HVA pixel electrode, comprising the steps of:

depositing a first metal material on a substrate, and etching said first metal material with a first photomask to form a first conductive metal layer through patterning;

depositing a first insulating material and a semiconductor material on said first conductive metal layer, and etching said semiconductor material with a second photomask to form a silicon island pattern through patterning, wherein an intermediate layer is formed by an exposed part of the first insulating material and the etched semiconductor material;

depositing a second metal material on said intermediate layer, and etching said second metal material with a third photomask to form a second conductive metal layer through patterning;

coating the patterned second conductive metal layer and an exposed part of the intermediate layer with a second insulating material, and etching said second insulating material with a fourth photomask for forming contact holes which at least extend to said second conductive metal layer, wherein the fourth photomask is designed to be able to form a three-dimensional insulating structure by etching; and coating a surface of said insulating structure and the exposed parts of other layers with a transparent conductive material, and etching said transparent conductive material with a fifth photomask to form a transparent conductive layer through patterning.

According to one embodiment of the present disclosure, said insulating structure has a structure in the shape of fishbone.

According to one embodiment of the present disclosure, said structure in the shape of fishbone comprises a horizontal trunk and a vertical trunk which are arranged to perpendicularly intersect with each other, and a plurality of branches extending from said horizontal trunk and said vertical trunk to two sides respectively with a certain angle, and wherein said branches and trunks are each configured as a protrusion, and a groove is formed between two adjacent branches.

According to one embodiment of the present disclosure, said groove of said insulating structure are formed by a transparent region of said fourth photomask.

According to one embodiment of the present disclosure, said transparent conductive layer obtained by said fifth photomask through etching covers the surfaces of said protrusion and said groove, thus forming said pixel electrode.

According to another aspect of the present disclosure, the present disclosure also provides an array substrate comprising pixel electrodes manufactured by the aforesaid method, said array substrate comprising:

a substrate; and a plurality of pixel units formed on said substrate, each of said pixel units comprising:

a pixel electrode arranged in an opening area, said pixel electrode being provided on an insulating structure, wherein said insulating structure comprises protrusions and grooves arranged in an alternating manner.

According to one embodiment of the present disclosure, said insulating structure has a structure in the shape of fishbone.

According to one embodiment of the present disclosure, said structure in the shape of fishbone comprises a horizontal trunk and a vertical trunk which are arranged to perpendicularly intersect with each other, and a plurality of branches extending from a middle part to two sides respectively with a certain angle, and wherein said branches and trunks are each configured as a protrusion, and a groove is formed between two adjacent branches.

According to one embodiment of the present disclosure, the width of said protrusion is different from the width of said groove.

According to one embodiment of the present disclosure, the width of said protrusion equals to the width of said groove.

The following beneficial effects can be achieved by the present disclosure.

According to the method of the present disclosure, the steps of forming the contact holes and forming the insulating structure through etching are combined into one step, a photomasking procedure is saved and the cost thereof is saved accordingly. In this manner, the manufacturing time of the array substrate can be shortened, and the production capacity can be improved. At the same time, the pixel electrodes cover the opening area completely, whereby the controllability of the pixel electrodes over liquid crystal molecules can be improved and the penetration of the liquid crystal display panel can be improved accordingly.

Other features and advantages of the present disclosure will be stated hereinafter, and part of them will become obvious in the description or become understandable through the embodiments of the present disclosure. The objectives and other advantages of the present disclosure can be achieved and obtained through the structures specified in the description, claims and drawings.

BRIEF DESCRIPTION OF THE DRAWINGS

The drawings which are necessary for illustrating the embodiments of the present disclosure or the prior art will be introduced hereinafter, in order to further interpret the technical solutions in the embodiments or in the prior art more clearly.

LIST OF REFERENCE SIGNS

1. Substrate
2. Gate line
3. Data line
4. Thin Film Transistor (TFT)
5. Pixel electrode
5a. Slit
5b. Protrusion
5c. Groove
6. Common electrode line
7. Contact hole
8. Gate insulating layer
9. Deposited passivation layer.

DETAILED DESCRIPTION OF THE EMBODIMENTS

The present disclosure will be explained in details with reference to the embodiments and the accompanying drawings, whereby it can be fully understood how to solve the technical problem by the technical means according to the present disclosure and achieve the technical effects thereof, and thus the technical solution according to the present disclosure can be implemented. It is important to note that as long as there is no structural conflict, all the technical features mentioned in all the embodiments may be combined together in any manner, and the technical solutions obtained in this manner all fall within the scope of the present disclosure.

In addition, the steps as shown in the flow chart can be executed in a computer system by a set of computer executable instructions. Although the logical sequence is shown in the flow chart, in some cases, the steps shown or described herein can be executed in other sequences different from the one shown herein.

Figure 1:
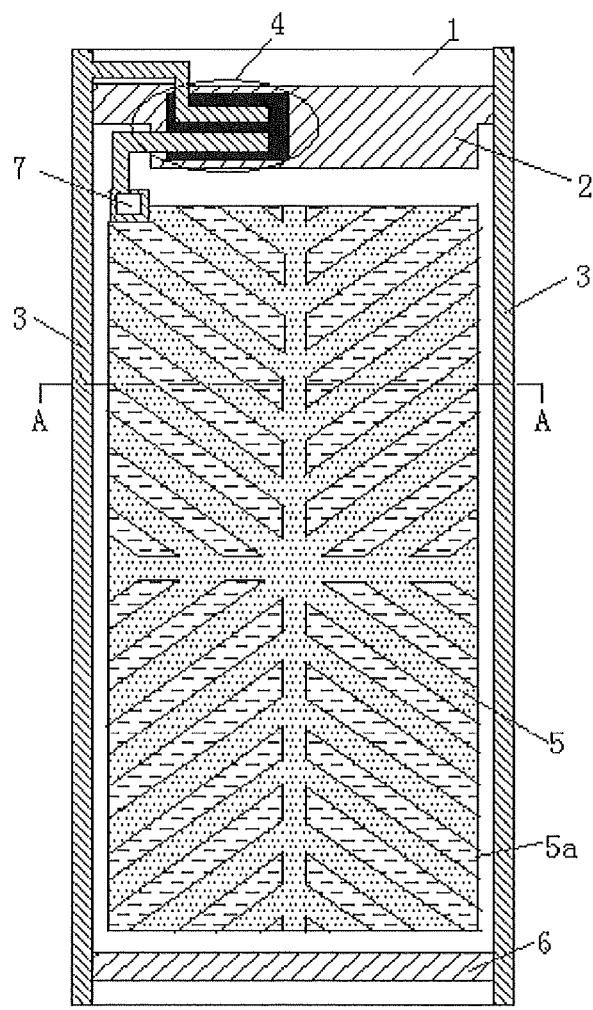
FIG. 1 is a plan view of a HVA pixel electrode with a Fine Slit structure in the prior art.

FIG. 1 shows an array substrate with a HVA pixel electrode having a Fine Slit structure in the prior art. The array substrate comprises a substrate 1 and a plurality of pixel units. Each of the pixel units comprises a gate line 2, a data line 3, a Thin Film Transistor 4, a pixel electrode 5 and a common electrode line 6 provided on the substrate 1, wherein the gate line 2 is parallel to the common electrode line 6, and the gate line 2 and the common electrode line 6 are both perpendicular to the data line 3. The Thin Film Transistor 4 is provided on the gate line 2, and the gate, source and drain of the TFT are electrically connected with the gate line 2, the data line 3 and the pixel electrode 5 respectively. In one arrangement, the Thin Film Transistor 4 is connected with the pixel electrode 5 through a contact hole 7. The pixel unit is provided with slits 5a, where no transparent conductive material is provided, and thus no pixel electrode is formed here.

Figure 2:
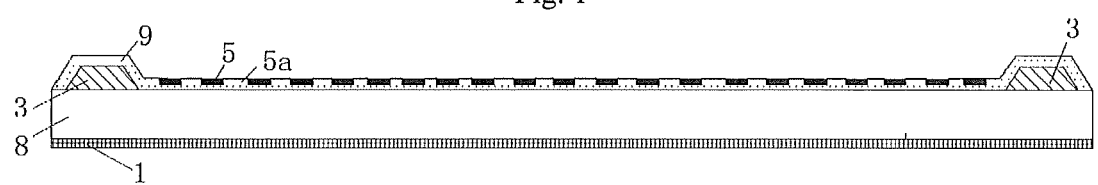
FIG. 2 is a sectional view of the structure as shown in FIG. 1 along line A-A.

FIG. 2 is a sectional view of the structure as shown in FIG. 1 along line A-A. As shown in FIG. 2, the substrate 1 is covered with a gate insulating layer 8. The data line 3 and the gate insulating layer 8 are covered with a deposited passivation layer 9, on which the pixel electrode 5 is provided. The pixel electrodes 5 are provided with slits 5a therebetween, where no conductive material is provided. Since no conductive material is provided on the slits 5a, the controllability of the slits over the electric field is poor, such that the controllability over the liquid crystal molecules thereof is poor accordingly. When the liquid crystal molecules are twisted under the control of the electric field, the liquid crystal molecules in the regions corresponding to the slits 5a cannot be twisted adequately, and consequently the light transmittance efficiency of these regions is affected. In this case, dark strips would appear in the regions corresponding to the slits 5a, the light transmittance efficiency of liquid crystal molecules is suffered, and then the penetration of the liquid crystal display panel is suffered. Therefore, a new manufacturing method for improving the structure of the pixel electrode and the array substrate comprising the pixel electrode with said structure to improve the light transmittance efficiency of liquid crystal molecules is needed.

Figure 3:
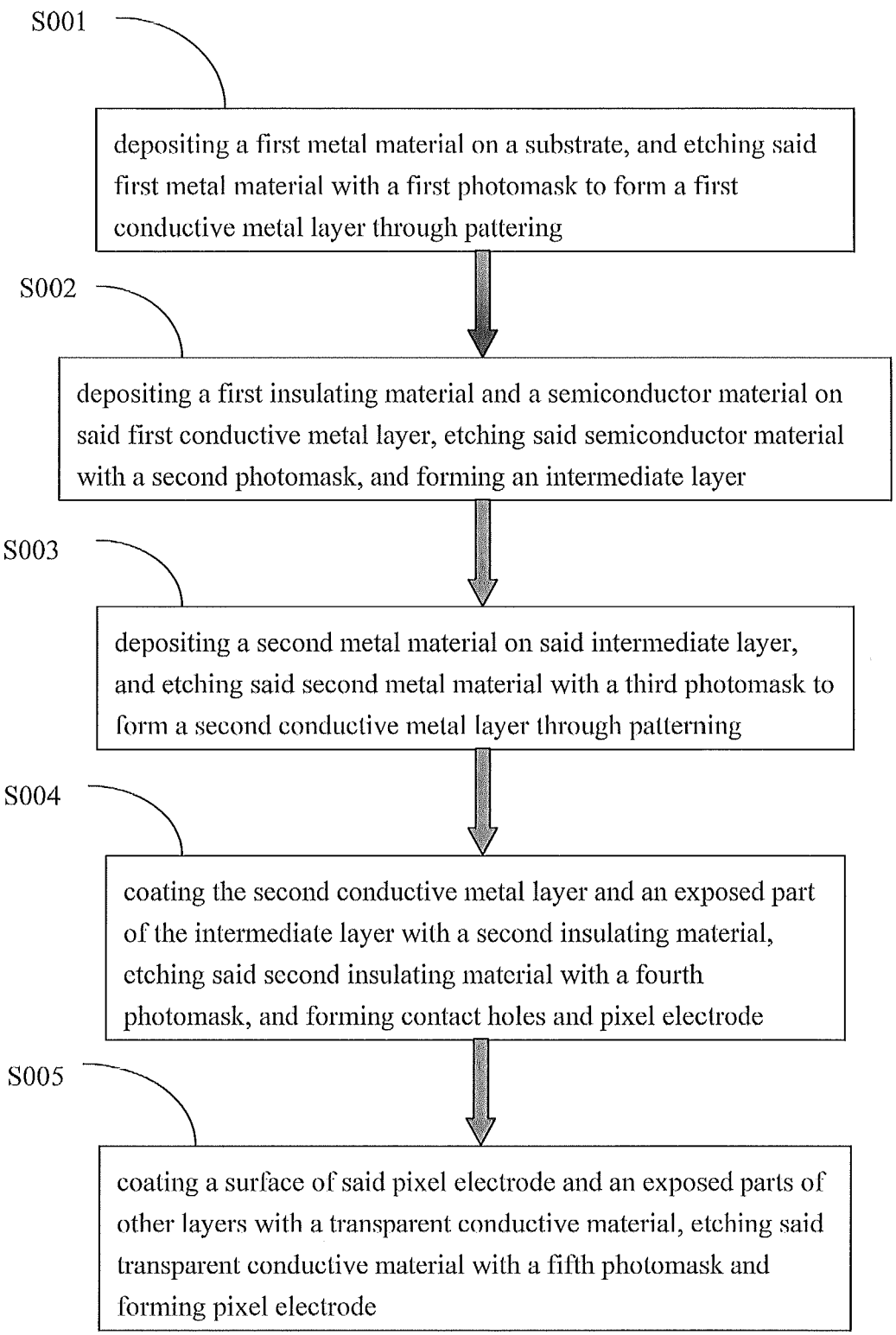
FIG. 3 is a flow chart of a method according to an embodiment of the present disclosure.

FIG. 3 shows a flow chart of a method for manufacturing a new pixel electrode according to the principle of the present disclosure.

In step S001, a first metal material is deposited on a selected substrate, and said first metal material is etched and patterned by a first photomask to form conductive metal layer. This first conductive metal layer corresponds to a gate metal layer. In this step, a metal layer is formed first on the substrate through sputtering. Subsequently, the metal layer is coated with positive photoresist, and then is exposed by a corresponding photomask. The gate metal layer can be obtained after developing process, wet etching process, and photoresist-stripping process.

In step S002, first, a first insulating material is deposited on said first conductive metal layer, and a gate insulating layer is formed. Then, a semiconductor material is deposited on the gate insulating layer, and is etched by a second photomask to form a silicon island pattern. The exposed part of the gate insulating layer and the etched semiconductor material are coated with positive photoresist, and then exposed by a corresponding photomask. An intermediate layer as required can be obtained after developing process, wet etching process, and photoresist-stripping process.

In step S003, a second metal material is deposited on the intermediate layer, and the second metal material is etched by a third photomask to form a second conductive metal layer. This second conductive metal layer comprises data lines, and the sources and drains of the Thin Film Transistors. In this step, a metal layer is formed first on the intermediate layer through sputtering. Subsequently, the metal layer is coated with positive photoresist, and then is exposed by a corresponding photomask. The second conductive metal layer can be obtained after developing process, wet etching process, and photoresist-stripping process.

In step S004, a passivation layer is deposited first on the exposed part of the intermediate layer and the second conductive metal layer, and then the deposited passivation layer is etched by a corresponding fourth photomask, whereby contact holes and an insulating structure can be formed simultaneously.

During this step, first, the passivation layer is deposited to provide insulation protection for the exposed part of the intermediate layer and the second conductive metal layer, and then the deposited passivation layer is etched. In one embodiment of the present disclosure, when a positive photoresist is used, the transparent region of the fourth photomask used here can be divided into two parts. One part of the transparent regions of the fourth photomask corresponds to the positions of contact holes of the array substrate, and contact holes extending to the second conductive metal layer are formed by said one part of the transparent regions of the fourth photomask. Another part of the transparent region of the fourth photomask corresponds to the opening areas of a part of the pixel units of the array substrate, and the insulating material of the array substrate corresponding to said another part of the transparent region of the fourth photomask is etched to form grooves. At the same time, the fourth photomask is further provided with an opaque region corresponding to the opening areas of other part of the pixel units of the array substrate. The insulating material of the array substrate corresponding to the opaque region is not etched, and thus protrusions are formed in the substrate. The protrusions and grooves of the array substrate form a three-dimensional insulating structure.

Under normal circumstances, the contact holes and the insulating material of the array substrate are formed through etching by two steps. That is to say, the insulating material of the array substrate is etched by one photomask to form the contact holes; and then, the insulating material of the array substrate is further etched by another photomask to form the protrusions and grooves. According to the present disclosure, the contact holes, the protrusions and grooves are etched and formed by the fourth photomask simultaneously. A photomask and its procedure can be saved in the manufacturing method, and the manufacturing cost can be saved. At the same time, the manufacturing time of the array substrate can be shortened, and the production capacity can be improved.

In step S005, the surface of the insulating structure and the exposed parts of other layers are coated with a transparent conductive material, and are etched by a fifth photomask to form a transparent conductive layer, i.e., the pixel electrode. The pixel electrode covers the protrusions and grooves of the whole insulating structure. Since the insulating structure is located in the opening area of the pixel unit, the pixel electrode covers the whole opening area of the pixel unit. Under the circumstances, the controllability of the pixel electrode over the electric field is improved, and the controllability over the liquid crystal molecules thereof is improved accordingly. The improvement of the controllability over the liquid crystal molecules would reduce the occurrence of the dark strips, so that the light transmittance efficiency of liquid crystal can be improved and the penetration of the liquid crystal display panel can be improved.

Figure 4:
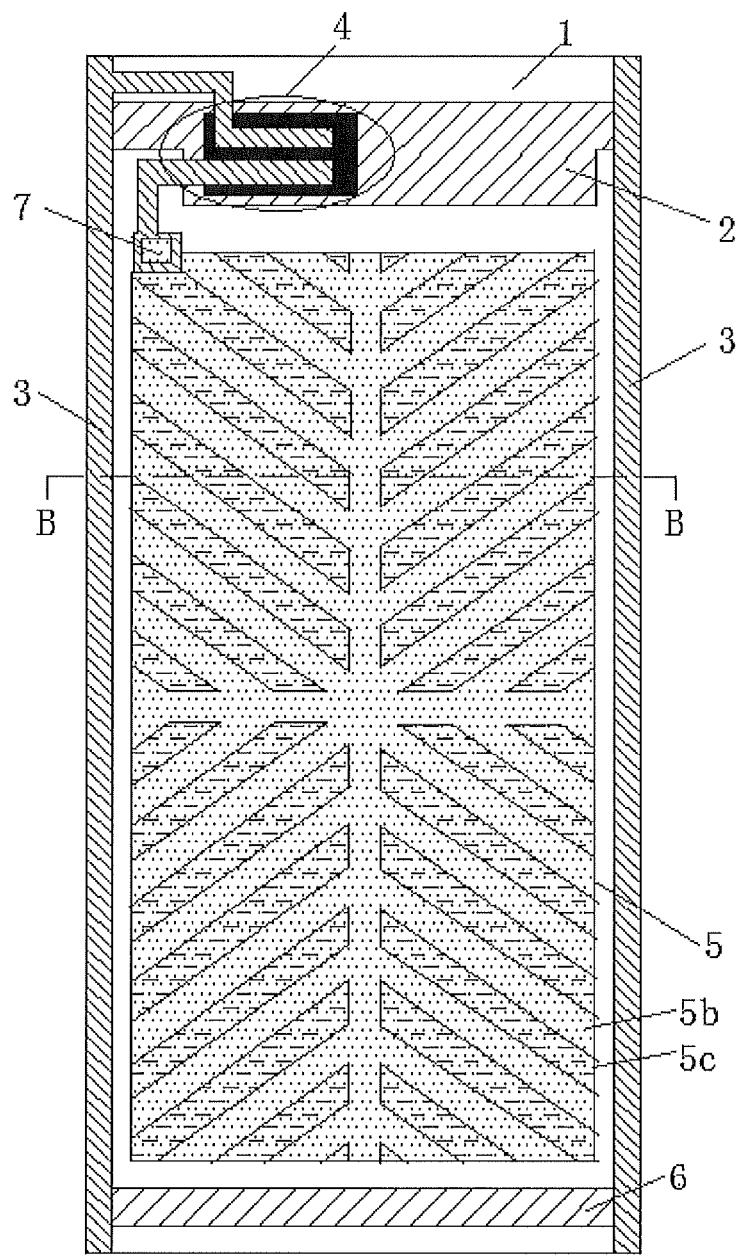
FIG. 4 is a plan view of an array substrate comprising a pixel electrode manufactured by the method according to an embodiment of the present disclosure.

FIG. 4 shows a plan view of an array substrate comprising a pixel electrode as aforementioned. As shown in FIG. 4, the array substrate comprises a substrate 1, and a plurality of pixel units. Each of the pixel units comprises a gate line 2, a data line 3, a Thin Film Transistor 4, a pixel electrode 5 and a common electrode line 6 provided on the substrate 1, wherein the gate line 2 is parallel to the common electrode line 6, and the gate line 2 and the common electrode line 6 are perpendicular to the data line 3. The Thin Film Transistor 4 is provided on the gate line 2, and the gate, source and drain of the TFT are electrically connected with the gate line 2, the data line 3 and the pixel electrode 5 respectively, wherein the drain of the TFT 4 is connected with the pixel electrode 5 through a contact hole 7. Protrusions 5b and the grooves 5c are arranged in an alternating manner, and constitute an insulating structure together. The pixel electrode 5 covers the insulating structure.

As shown in FIG. 4 again, the insulating structure has a structure in the shape of fishbone. The structure in the shape of fishbone comprises a horizontal trunk and a vertical trunk which are arranged to perpendicularly intersect with each other, and a plurality of branches extending from the two trunks to two sides respectively with a certain angle. The angle formed by each branch and the trunk from which said branch extends ranges from 30° to 60°. The branches and trunks are each configured as a protrusion, and a groove is formed between two adjacent branches. The protrusions and grooves are arranged in an alternating manner. In one embodiment of the present disclosure, the width of said protrusion equals to the width of said groove, as shown in FIG. 4. In another embodiment of the present disclosure, the width of said protrusion is different from the width of said groove.

Figure 5:
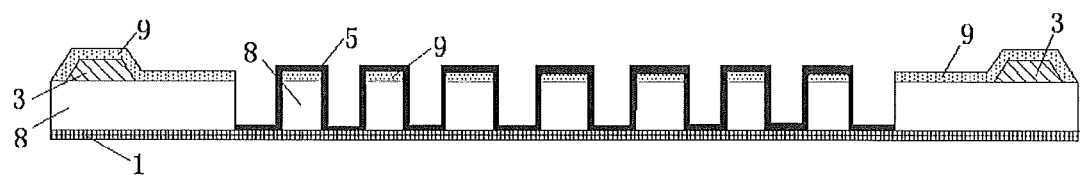
FIG. 5 is a sectional view of the structure as shown in FIG. 4 along line B-B.

FIG. 5 is a sectional view of the structure as shown in FIG. 4 along line B-B. As shown in FIG. 5, the substrate 1 is covered with a gate insulating layer 8. The data line 3 and the gate insulating layer 8 are covered with a deposited passivation layer 9. An insulating structure is located between the pixel electrode 5 and the substrate 1, and the insulating structure comprises protrusions and grooves. The protrusions and grooves are covered with a transparent conductive material, and the pixel electrode is formed. In this manner, the covering area of the pixel electrode of the liquid crystal display panel is improved, and the controllability of the pixel electrode over the liquid crystal molecules thereof is improved accordingly. The improvement of the controllability over the liquid crystal molecules would reduce the occurrence of the dark strips, so that the light transmittance efficiency of liquid crystal can be improved and the penetration of the liquid crystal display panel can be improved.

The present disclosure discloses the embodiments hereinabove, but the embodiments are adopted to facilitate the understanding of the present disclosure, rather than to limit the present disclosure. Any one skilled in the art may make any modifications and changes to the forms and details of the embodiments without departing from the spirit and scope of the present disclosure. The protection scope of the present disclosure shall be determined by the scope as defined in the claims.

The invention claimed is:

1. A method for manufacturing a HVA pixel electrode, comprising the steps of:
   depositing a first metal material on a substrate, and etching said first metal material with a first photomask to form a first conductive metal layer through patterning;
   depositing a first insulating material and a semiconductor material on said first conductive metal layer, and etching said semiconductor material with a second photomask to form a silicon island pattern through patterning, wherein an intermediate layer is formed by an exposed part of the first insulating material and the etched semiconductor material;

depositing a second metal material on said intermediate layer, and etching said second metal material with a third photomask to form a second conductive metal layer through patterning;

coating the patterned second conductive metal layer and an exposed part of the intermediate layer with a second insulating material, and etching said second insulating material with a fourth photomask for forming contact holes which at least extend to said second conductive metal layer, wherein the fourth photomask is used to form a three-dimensional insulating structure by etching; and coating a surface of said insulating structure and the exposed parts of other layers with a transparent conductive material, and etching said transparent conductive material with a fifth photomask to form a transparent conductive layer through patterning.

2. The method for manufacturing a HVA pixel electrode according to claim 1, wherein said insulating structure has a structure in the shape of fishbone.

3. The method for manufacturing a HVA pixel electrode according to claim 2, wherein said structure in the shape of fishbone comprises a horizontal trunk and a vertical trunk which are arranged to perpendicularly intersect with each other, and a plurality of branches extending from said horizontal trunk and said vertical trunk to two sides respectively with a certain angle, and wherein said branches and trunks are each configured as a protrusion, and a groove is formed between two adjacent branches.

4. The method for manufacturing a HVA pixel electrode according to claim 3, wherein said groove of said insulating structure are formed by a transparent region of said fourth photomask.

5. The method for manufacturing a HVA pixel electrode according to claim 4, wherein said transparent conductive layer obtained by said fifth photomask through etching covers the surfaces of said protrusion and said groove, thus forming said pixel electrode.

* * * * *